US006476741B2

(12) United States Patent
Cherubal et al.

(10) Patent No.: US 6,476,741 B2
(45) Date of Patent: Nov. 5, 2002

(54) METHOD AND SYSTEM FOR MAKING OPTIMAL ESTIMATES OF LINEARITY METRICS OF ANALOG-TO-DIGITAL CONVERTERS

(75) Inventors: Sasikumar Cherubal, Atlanta; Abhijit Chatterjee, Marietta, both of GA (US)

(73) Assignee: Georgia Tech Research Corp., Atlanta, GA (US)

( * ) Notice: Subject to any disclaimer, the term of this patent is extended or adjusted under 35 U.S.C. 154(b) by 0 days.

(21) Appl. No.: 09/838,359

(22) Filed: Apr. 19, 2001

(65) Prior Publication Data

US 2002/0030615 A1 Mar. 14, 2002

Related U.S. Application Data

(60) Provisional application No. 60/198,355, filed on Apr. 19, 2000.

(51) Int. Cl.⁷ .................................................. H03M 1/10
(52) U.S. Cl. ........................................ 341/120; 341/155
(58) Field of Search .................................. 341/120, 155, 341/156, 116, 118, 126, 140, 169, 170, 121, 138

(56) References Cited

U.S. PATENT DOCUMENTS

| | | | | |
|---|---|---|---|---|
| 5,959,563 A | * | 9/1999 | Ring | 341/155 |
| 6,177,894 B1 | * | 1/2001 | Yamaguchi | 341/120 |
| 6,326,909 B1 | * | 12/2001 | Yamaguchi | 341/120 |

OTHER PUBLICATIONS

S. Cherubal and A. Chatterjee, "Test Generation Based Diagnosis of Device Parameters for Analog Circuits," IEEE Paper (2001), 596–602.

C.J.B. Spanos and S.W. Director, "Parameter Extraction for Statistical IC Process Characterization," IEEE Transaction on Computer–Aided Design, vol. 5, Cad–5 (Jan. 1986) 66–78.

G. Freedman, W. Lukaszek and J.Y.C. Pan, "Merlin: A Device Diagnosis System Based on Recursive Inverse Approximation," IEEE Transactions on Semiconductor Manufacturing, vol. 6, No. 4 (Nov. 1993) 306–317.

M. Qu and M.A. Styblinski, "Parameter Extraction for Statistical IC Modeling Based on Recursive Inverse Approximation," IEEE Transactions on Computer–Aided Deisgn of Integrated Circuits and Systems, vol. 6, No. 11 (Nov. 1997) 1250–1259.

S. Cherubal and A. Chatterjee, "Parametric Fault Diagnosis for Analog Systems Using Functional Mapping," Proceedings, Design, Automation and Test in Europe (1999) 195–200.

P.A. Variyam and A. Chatterjee, "Specification–Driven Test Design for Analog Circuits," International Symposium on Defect and Fault Tolerance in VLSI Systems (1998) 335–340.

(List continued on next page.)

*Primary Examiner*—Brian Young
*Assistant Examiner*—John Nguyen
(74) *Attorney, Agent, or Firm*—Birdwell, Janke & Durando, PLC

(57) ABSTRACT

A method and system for making optimal estimates of linearity metrics of analog-to-digital converters. A model building phase and a production test strategy are employed. During the model-building phase, a linear model an analog-to-digital converter is constructed from a set of accurately measured transition code voltages for a set of training analog-to-digital converters. During a production test of an individual analog-to-digital converter, a ramp test signal is applied to the individual analog-to-digital converter, a histogram of codes is produced, and the transition code voltages for the individual analog-to-digital converter are estimated from the resulting histogram. Linearity characteristics of the individual analog-to-digital converter may then be computed.

17 Claims, 3 Drawing Sheets

OTHER PUBLICATIONS

P.N. Variyam and A. Chatterjee, "Test Generation for Comprehensive Testing of Linear Analog Circuits Using Transient Response Sampling," International Conference on Computer–Aided Design (1997) 382–385.

R. Voorakaranam and A. Chatterjee, "Test Generation for Accurate Prediction of Analog Specifications," Proceedings, IEEE VLSI Test Symposium (2000) 137–142.

S. Chakrabati and A. Chatterjee, "Partial Simulation–Driven Test Generation for Fault Detection and Diagnosis in Analog Circuits," Proceedings, ICCAD (2000) 562–567.

E. Liu, W. Kao, E. Felt and A. Sangiovanni–Vincentelli, "Analog Testabillity Analysis and Fault Diagnosis Using Behavioral Modeling," Proceedings, IEEE Custom Integrated Circuits Conference (1994) 413–416.

B. Kaminska, K. Arabi, I. Bell, P. Goeteti, J.L. Huertas, B. Kim, A. Rueda and M. Soma, "Analog and Mixed–Signal Benchmark Circuits –First Release," Proceedings, International Test Conference (1997) 183–190.

N.B. Hamida and B. Kaminska, "Analog Circuit Testing based on Sensitivity Computation and New Circuit Modeling," Proceedings, International Test Conference (1993) 331–343.

G. Devarayanadurg and M. Soma, "Dynamic Test Signal for Analog ICs," Proceedings, International Conference on Computer Aided Design (1995) 627–629.

H.H. Zheng, A. Balivada and J.A. Abraham, "A Novel Test Generation Approach for Parametric Faults in Linear Analog Circuits," VLSI Test Symposium (1996) 470–475.

N. Nagi, A. Chatterjee, A. Balivada and J.A. Abraham, "Fault–Based Automatic Test Generation for Linear Analog Devices," Proceedings, International Conference on Computer Aided Design (1993) 88–91.

P.N. Variyam and A. Chatterjee, "Efficient test generation for transient testing of analog circuits using partial numerical simulation," Proceedings, IEEE, VLSI Test Symposium (1999) 214–219.

R. Voorakaranam and A. Chatterjee, "Hierarchical Test Generation for Analog Circuits Using Incremental Test Development," Proceedings, IEEE VLSI Test Symposium (1999) 296–301.

W.M. Lindermeir, H.E. Graeb and K.J. Antreich, "Analog Testing by Characteristic Observation Inferences, " IEEE Transaction on Computer–aided Design of Integrated Circuits and Systems, vol. 18 (Sep. 1999) 1353–1368.

A.V. Gomes and A. Chatterjee, "Minimal Length Diagnostic Tests for Analog Circuits Using Test History," Design, Automation and Test in Europe (1999) 189–194.

D.S. Watkins, Fundamentals of Matrix Computation (John Wiley and Sons, 1991).

D. Levine, "PGAPack Parallel Genetic Algorithm Library," Department of Mathematics and Computer Science, Argonne National Laboratory.

J.H. Friedman, "Multivariate Adaptive Regressions Splines," The Annals of Statistics, vol. 19, No. 1, 1–141.

S. Dowdy and S. Wearden, "Statistics for Research" (John Wiley and Sons, 1991).

G. Devarayanadurg, P. Goeteti and M. Soma, "Hierarchy–Based Statistical Fault Simulation of Mixed–Signal ICs," International Test Conference (1996) 521–527.

R. Pease, "Troubleshooting Analog Circuits," (Butterworth Heinmann, 1990) 90–96.

Coley, David A, "An Introduction to Genetic Algorithms for Scientists and Engineers" (World Scientific, 1996).

* cited by examiner

METHOD AND SYSTEM FOR MAKING OPTIMAL ESTIMATES OF LINEARITY METRICS OF ANALOG-TO-DIGITAL CONVERTERS

RELATED APPLICATIONS

This application is based on Provisional Application Ser. No. 60/198,355 filing date Apr. 19, 2000, hereby incorporated by reference in its entirety.

BACKGROUND OF THE INVENTION

This invention relates to production testing of integrated electronic circuits, and particularly to testing of analog-to-digital converter ("ADC") circuits as they are produced to determine their functional specifications.

ADCs are characterized by functional specifications., such as integral nonlinearity ("INL") and differential nonlinearity ("DNL"). To determine whether a given ADC that has been manufactured meets the required specifications, it must be tested. Conventional testing of ADCs as they are produced involves direct measurement of their functional specifications. However, as ADCs continue to improve in resolution, direct measurement has become more time time consuming and expensive. The measurement of INL and DNL, that is, linearity testing, constitutes the major portion of the ADC test time (35–50%) and, therefore, the major portion of the test cost for ADCs.

The measurement of INL and DNL involves the measurement of all the code transitions voltages ("CTs") (the voltage input at which the output code of an ADC changes) of an ADC. In response to the problem of increasing test times, various techniques have been developed that estimate all of the CTs from a subset of CT measurements. Such techniques are described, for example, in: 117 G. N. Stenbakken and T. M. Souders, "Test-Point Selection and Testability Measures via QR Factorization of Linear Models," *IEEE Transactions on Instrumentation and Measurement*, Vol. IM-36, No. 2. June 1987, pp 406–410 ("Stenbakken and Souders I"); T. M. Souders and G. N Stenbakken. "A Comprehensive Approach to Modeling and Testing of Mixed-signal Devices," *Proceeding of IEEE International Test Conference*, 1990, pp 169–176 ("Souders and Stenbakken"); G. N. Stenbakken and T. M. Souders. "Linear Error Modeling of Analog and Mixed-Signal Devices," *Proceeding of IEEE Internationial Test Conference*, 1991, pp 573–581 ("Stenbakken and Souders II"); G. N. Stenbakken and T. M. Souders, "Developing Linear Error Models for Analog Devices," *IEEE Transactions on Instrumentation and Measurements*, Vol. 43, No. 2, April 1994, pp 157–163 ("Stenbakken and Souders III"); and T. D. Lyons, The Production Implementation of a Linear Error Modeling "Technique," *Proceeding of IEEE International Test Conference*, 1992, pp 399–404 ("Lyons").

Techniques such as those described in the aforementioned references are based on two assumptions. First, for most high resolution ADCs, the number of variables, such as the values of resistors, capacitors and transistor transconductances, which control their linearity is much less than the total number of CTs. Second, the variations in these variables is typically small so that the relationship between these variables and the corresponding CTs can be well approximated by a linear function. second order or higher order terms being negligible. Techniques for using a linear model with three different production test methods to save test time have been described in P. D. Capofreddi and B. A. Wooley, "The Use of Linear Models in A/D Converter Testing," *IEEE transactions on Circuits and Systems-I: Fundamental Theory and Applications*, Vol. 44, No. 12, December 1997, pp 1105–1113 ("Capofreddi and Wooley I"), and P. D. Capofreddi and B. A. Wooley, "The Use of Linear Models for the Efficient and Accurate Testing of A/D Converters," *Proceeding of IEEE International Test Conference*, 1995, pp 54–60 (Capofreddi and Wooley II").

INL and DNL are measures of how much the CTs of an ADC differ from ideal linear behavior. Specifically, DNL is a measure of the deviation from the ideal 1 least significant bit ("LSB") of the voltage span that is associated with each output code. INL is the worst case deviation of an ADC transfer function from the line between the measured end points (zero and full scale) of the ADC. INL and DNL are usually expressed in LSBs. These measures are illustrated on FIG. 1.

DNL and INL can be expressed in terms of the CTs as:

$$DNL_i = \left(\frac{\gamma_i - \gamma_{i-1}}{1LSB}\right) - 1 \quad (1)$$

$$INL_i = \frac{\gamma_i - \gamma_1 - ((\gamma_{2^n-1} - \gamma_1)/(2^n - 2))\cdot(i-1)}{1LSB} \quad (2)$$

where $\gamma_i$ is the $i^{th}$ CT, n is the number of bits in the ADC, and

1LSB denotes the ideal voltage span of 1 LSB of the ADC.

Since INL and DNL can be easily computed with a few algebraic operations once the CTs are known, the task in determining the INL and DNL is to determine the CTs, that is, the $\gamma_i$s. INL and DNL measurements usually involve the measurement of all the CTs of an ADC. At least three different techniques can be used for the measurement of INL and DNL of ADCs, as described in S. Max, "Fast Accurate and Complete ADC Testing," *Proceeding of IEEE International Test Conference*, 1989, pp 111–117 (hereinafter "S. Max"). The three techniques are (i) the servo-loop method, (ii) the ramp histogram method (tally and weight method) and (iii) the sine wave histogram method (aka code density method). The servo loop method involves the use of an analog integrator in a feedback loop and has a long test time because of the large settling time of the integrator and the long conversion time of the DC voltmeter used to measure code transitions. A fast variant of the servo-loop method using an accurate digital-to-analog converter in a feedback loop is described in S. Max, supra, but this requires a more complex interface board design for the Device-Under-Test ("DUT") and a non-standard test interface. Therefore, linearity testing of most ADCs is performed using the ramp histogram technique. T. Kuyel, "Linearity Testing Issues of Analog to Digital Converters," *Proceeding of IEEE International Test Conference*, 1999, pp 747–756. The sine wave histogram technique has a worst-case error in linearity measurements that is π times the error of a ramp of the same test length (test time) and therefore is used only in cases where generation of a ramp with the required linearity is not possible. J. Doemberg, Hae-Seung Lee and D. A. liodges, "Full-Speed Testing of A/D Converters," *IEEE Journal of Solid-State Circuits*, Vol. SC-19, NO. 6, December 1984, pp 820–827. The servo-loop method measures CTs one at a time, while the histogram techniques estimate all the CTs in one pass. Therefore, the histogram methods are inherently faster. In the ramp histogram method for estimating CTs, a linear ramp or triangular wave is applied to the input of the ADC and a histogram of the output codes is computed. The CTs are estimated from the histogram using $$\gamma_i = V_0 + \frac{(V_F - V_0)}{N} \cdot \left( \sum_{j=0}^{i} c_j \right)$$

where $V_0$ is the initial (minimum) value of the ramp, $V_F$ is the final (maximum) value of the ramp, $c_i$ is the number of occurrences of code i, and N is the total number of samples in the histogram.

The INL and DNL can also be directly computed from the histogram without the computation of the CTs. For computing the DNL using a triangular wave or linear ramp, the probability that the input voltage is within a given interval is directly proportional to the width of the interval. Consequently, the width of each code (the voltage interval of the input voltage for which the output is equal to a given code) will be proportional to the number of occurrences of the given code in the histogram. Therefore, an estimate of the DNL of the ADC is given by $$DNL_i = \frac{c_i}{\left( \sum_{j=1}^{2^n-2} c_j \right) / (2^n - 2)} - 1$$

The input waveform span is usually set to be slightly larger than the input range of the ADC to ensure occurrence of all codes. Therefore the first and last code counts are ignored in the DNL computation. The INL, for the ADC is given by $$INL_i = \sum_{j=1}^{i} DNL[j]$$

These equations give the same DNL and INL, respectively, as those computed by Equations 1 and 2, above.

The number of variables that control the CTs of an ADC is much less than the number of CTs. The CTs have, therefore, been modeled by a linear model. Stenbakken and Souders I; Souders and Stenbakken; Stenbakken and Souders II; Stenbakken and Souders III; Lyons; Capofreddi and Wooley I; and Capofreddi and Wooley II, supra. The model is expressed as:

$$\bar{\gamma} = \overline{m}_\gamma + A_\gamma \cdot \bar{\theta}$$

where $\bar{\gamma}$ are the 2n−1 CTs of an ADC, m are the means (nominal values) of the CTs, $\bar{\theta}$ is a set of scaling variables which control the variation in transition levels, and $A_\gamma$ is a matrix which relates the variables θ to the CTs linearly.

The model can be created from a set of training data, that is, a set of measured CTs for a plurality w of ADCs. The training data can be denoted by a matrix $\hat{X} = [\hat{x}_{ij}]$, where $1 \leq i \leq 2^n - 1$ represents the index for the CTs, $1 \leq j \leq w$ represents the index for the ADCs, and $\hat{x}_{ij}$ represents the measured CTs. The mean CTs $\hat{m}_{\gamma i}$ are estimated using $$\hat{m}_{\gamma,i} = \frac{1}{w} \sum_{j=1}^{w} \hat{x}_{i,j}$$

where the matrix $A_\gamma$ is determined using a principal value decomposition of $\hat{X}$.

An efficient way to do this is to subtract the mean transition level $\hat{m}_{\gamma i}$ from the measured transitions $\hat{x}_{ij}$ as $x'_{ij} = \hat{x}_{ij} - \hat{m}_{\gamma i}$, and then perform a singular value decomposition of the resulting matrix. Singular value decomposition resolves the resulting matrix X' into a product of three matrices $$X' = U \Sigma V^T$$

where U and V are orthogonal matrices, and

Σ is a diagonal matrix whose entries are arranged in a decreasing order.

D. S. Watkins, "Fundamentals of Matrix Computations." John Wiley and Sons, 1991. The matrix $A_\gamma$ is obtained by extracting the first p columns of U, where p is the number of diagonal elements of Σ that have significant value. Stenbakken and Souders III, supra. The operation is as follows:

$$\hat{X} = \begin{bmatrix} \hat{x}_{1,1} & \hat{x}_{1,2} & \cdots & \hat{x}_{1,w} \\ \hat{x}_{2,1} & \hat{x}_{2,1} & \cdots & \hat{x}_{2,w} \\ \cdots & \cdots & \cdots & \cdots \\ \hat{x}_{2^n-1,1} & \hat{x}_{2^n-1,2} & \cdots & \hat{x}_{2^n-1,w} \end{bmatrix}$$

$$\hat{m}_{\gamma,i} = \frac{1}{w} \sum_{j=1}^{w} \hat{x}_{i,j}$$

$$X' = \hat{X} - \begin{bmatrix} \hat{m}_{\gamma,1} & \hat{m}_{\gamma,1} & \cdots & \hat{m}_{\gamma,1} \\ \hat{m}_{\gamma,2} & \hat{m}_{\gamma,2} & \cdots & \hat{m}_{\gamma,2} \\ \cdots & \cdots & \cdots & \cdots \\ \hat{m}_{\gamma,2^n-1} & \hat{m}_{\gamma,2^n-1} & \cdots & \hat{m}_{\gamma,2^n-1} \end{bmatrix}$$

$$X' = \begin{bmatrix} u_{1,1} & u_{1,2} & \cdots & u_{1,w} \\ u_{2,1} & u_{2,1} & \cdots & u_{2,w} \\ \cdots & \cdots & \cdots & \cdots \\ u_{2^n-1,1} & u_{2^n-1,2} & \cdots & u_{2^n-1,w} \end{bmatrix}_{2^n-1 \times w} \cdot \begin{bmatrix} \Sigma_1 & 0 & 0 \cdots & 0 & 0 \\ 0 & \Sigma_2 & \cdots & 0 & 0 \\ \cdots & \cdots & \Sigma_{n_p} & 0 & 0 \\ 0 & 0 & 0 & \varepsilon & 0 \\ 0 & 0 & 0 & 0 & \varepsilon \end{bmatrix}_{w \times w} \cdot \begin{bmatrix} v_{1,1} & v_{1,2} & \cdots & v_{1,w} \\ v_{2,1} & v_{2,1} & \cdots & v_{2,w} \\ \cdots & \cdots & \cdots & \cdots \\ v_{w,1} & v_{w,2} & \cdots & v_{w,w} \end{bmatrix}_{w \times w}$$

The resulting $A_\gamma$ matrix has orthonormal columns, that is, $$\bar{A}_{\gamma i}^T \cdot \bar{A}_{\gamma i} = \begin{cases} 0 & i \neq j \\ 1 & i = j \end{cases}$$

where $\bar{A}_{\gamma i}$ is the $i^{-th}$ column of $A_\gamma$.

Given $A_\gamma$, the variables $\bar{\theta}$ can be estimated using $$\bar{\theta} = (A_\gamma^T A_\gamma)^{-1} A_\gamma^T \cdot (\bar{\gamma} - \overline{m}_\gamma) \qquad (3)$$

The variables $\bar{\theta}$ of an empirical model derived in this manner have no physical significance; for example, they cannot be associated with the value of a single capacitor or resistor within the ADC. An estimate of the standard deviation of the scaling variables $\theta_i$ is given by $$\hat{\sigma}_{\theta i} = \frac{s_i}{\sqrt{w-1}}$$

where $s_i$ is the $i^{th}$ diagonal element of the matrix $\Sigma$ ($i^{th}$ singular value).

The variables $\bar{\theta}$ may be estimated from a subset of all the CTs, Stenbakken and Souders I; Souders and Stenbakken; Stenbakken and Souders II; Stenbakken and Souders III; and Lyons, supra, to compute all the CTs from Equation 3. However, to measure a subset of the CTs the servo-loop technique has to be used, and this technique is not widely used in industry because of its long test time.

A technique for improving the accuracy of INL and DNL estimates based on a histogram of CTs is disclosed in Capofreddi and Wooley I and Capofreddi and Wooley II, supra. The technique involves the following steps: A coarse (noisy) estimate of the CTs of an individual ADC is obtained using a ramp with a reduced number of samples (ramp with reduced test time). The scaling variables that control the CTs of the ADC are estimated using $$\bar{\theta}=(A_\gamma^T A_\gamma)^{-1} A_\gamma^T \cdot (\hat{\bar{\gamma}} - \bar{m}_\gamma) = A_\gamma^T \cdot (\hat{\bar{\gamma}} - \bar{m}_\gamma)$$

where $\hat{\bar{\gamma}}$ are the (coarse) estimates of CTs computed from the histogram; and $A_\gamma$ is the linear model matrix.

The CTs are then computed from the $\bar{\theta}$ using Equation 3. This method gives a reduction in the standard deviation of the measurement noise in CT estimates by a factor of approximately $[p/2^n]^{1/2}$. This reduction in noise occurs because the linear modeling technique reduces the $2^n-1$ CTs to p variables, and this has an inherent averaging effect on the measurement noise.

Although the latter estimation technique improves upon the accuracy in determining the CTs, it still requires considerable time to obtain satisfactory accuracy. Therefore, there is a need for an improved method and system for computing the scaling variables, and thereby estimating the CTs, for an ADC after production that reduces the amount of time required while maintaining the desired accuracy.

SUMMARY OF THE INVENTION

It has been found that, if the variance of measurement errors in $\bar{\gamma}$ obtained from a histogram can be estimated, and the variance of the variables $\bar{\theta}$ are known, more accurate estimates of the variables $\bar{\theta}$ can be made than has heretofore been recognized. From these optimal estimates for $\bar{\theta}$, an improved estimate of $\bar{\gamma}$ can be made, resulting in reduced test time required in comparison to the servo-loop and prior histogram methods.

The method of the present invention comprises a model building phase and a production test strategy. During the model-building phase, a linear model of an ADC is constructed from a set of accurately measured CTs for a set of training ADCs. The average input-referred noise for the training ADCs is also measured from the set of ADCs. Based on the measured CTs and the measured noise, the standard deviation $\sigma_\theta$ of the $\bar{\theta}$, the standard deviation $\sigma_{e\gamma}$ of the error in $\bar{\gamma}$ and the variance in $\bar{\gamma}$ due to noise are computed.

A minimal test length N, that is, the duration of the ramp input from its initial value $V_O$ to its final value $V_F$, is selected that will give the required accuracy in the CT estimates. During a production test of an individual ADC, a ramp of the selected test length is applied to the individual ADC, a histogram of codes is produced, and the CTs for the individual ADC are estimated from the resulting histogram. Then, using the parameters computed during the training phase, that is, ($\sigma_\theta$, $\sigma_{e\gamma}$ and $A_\gamma$, an optimal estimate for the CTs is made. INL, and DNL, as well as other characteristics, may then be computed for the individual ADC.

Therefore, it is a principal object of the present invention to provide a novel and improved method and system for making optimal estimates of linearity metrics of analog-to-digital converters.

It is another object of the present invention to provide a novel and improved method and system for production testing of the linearity metrics of analog-to-digital converters.

It is a further object of the present invention to provide a method and system for rapidly estimating linearity metrics of an individual analog-to-digital converter based on a histogram of transition code voltages and a statistical model constructed from a training set of like analog-to-digital converters.

It is yet another object of the present invention to provide a method and system for estimating linearity metrics of an analog-to-digital converter with increased accuracy by employing a least squares estimate based on the variance of errors in measurements of the transition code voltages.

The foregoing and other objects, features, and advantages of the invention will be more readily understood upon consideration of the following detailed description of the invention, taken in conjunction with the accompanying drawings.

DETAILED DESCRIPTION OF THE INVENTION

In the present invention a histogram approach is used for estimating INL and DNL because of the reduced test time required in comparison to the servo-loop method. It has been found that, if the variance of measurement errors in $\bar{\gamma}$ obtained from a histogram can be estimated, and the variance of the variables $\bar{\theta}$ are known, more accurate estimates of the variables $\bar{\theta}$ can be made than has heretofore been recognized. From these optimal estimates for $\bar{\theta}$, an improved estimate of $\bar{\gamma}$ can be made.

Overview of the Test Strategy

Figure 1:
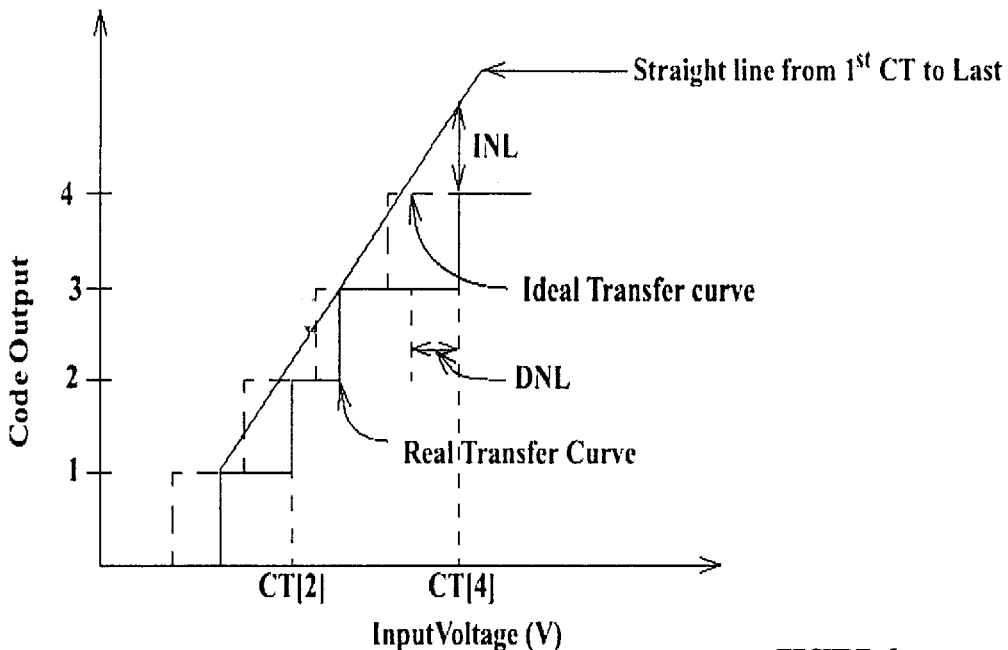
FIG. 1 is a graph of a transfer function of a representative analog-to-digital converter, showing deviations of the transfer function from the ideal.
Figure 2:
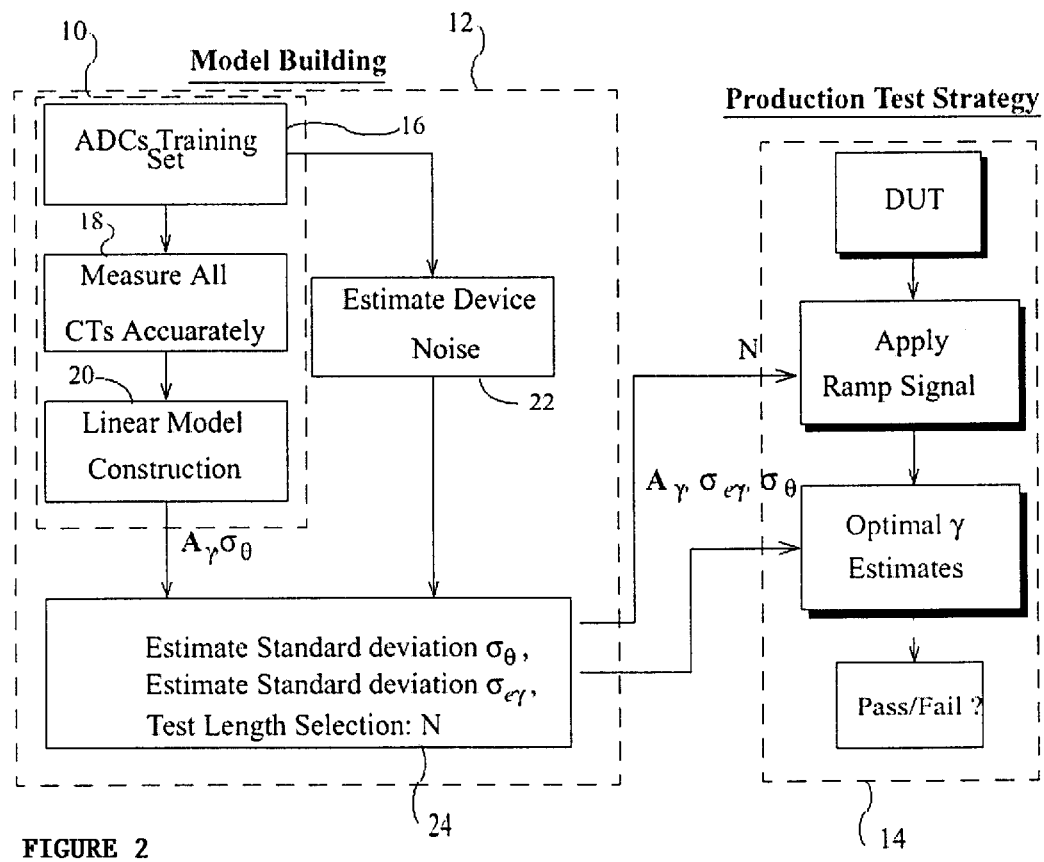
FIG. 2 is a block diagram of a system for testing analog-to-digital converters according to the present invention.

The method of the present invention is illustrated generally in FIG. 2. The steps within box 10 have been employed in the prior art, as discussed in the Background of the Invention, while the remaining steps represent improvements to the prior art. The present invention comprises an off-line model building phase, represented by the steps in box 12, and a production test strategy, represented by the steps in box 14.

During the model-building phase, a linear model ($m_\gamma$, $A_\gamma$) for the ADC is constructed from a set of training data (accurately measured CTs for a set of ADCs) as described in the Background of the Invention. Specifically, a ramp input is applied to a training set of ADCs of the type to be tested, typically 100 to 150 units, as shown by box 16, and the CTs of all ADCs of the training set are accurately measured, as shown by box 18. The linear model ($m_\gamma$, $A_\gamma$) is then constructed from the measured data, as shown by box 20 and explained in the Background of the Invention.

The average input-referred noise for the ADCs is also measured from the training set, as shown by box 22. Based on the measured CTs and the measured noise, the parameters required for making optimal estimates of the CTs, that is, the standard deviation $\sigma_\theta$ of the $\bar\theta$ and the standard deviation $\sigma_{e_\gamma}$ of the error in $\bar\gamma$ due to noise are computed, as shown by box 24.

Figure 3:
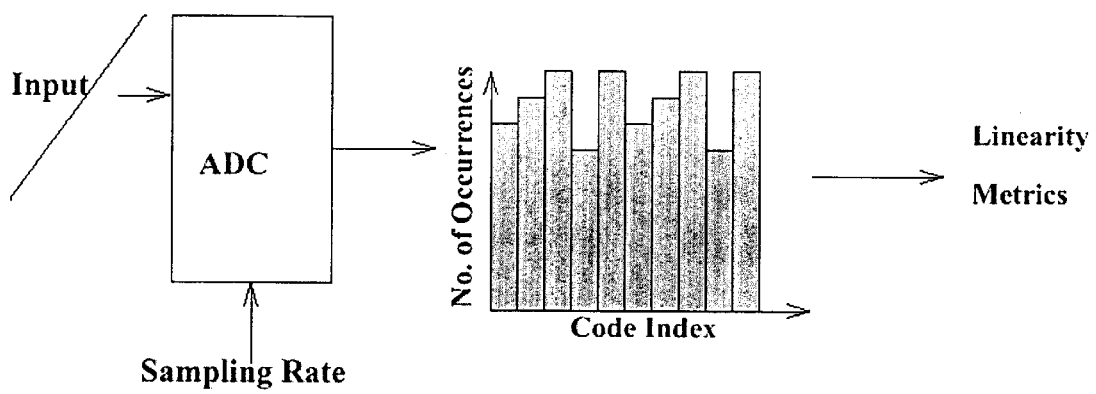
FIG. 3 shows a histogram of test results for an analog-to-digital converter in response to a ramp input.

A minimal test length N, that is, the duration of the ramp input from its initial value $V_O$ to its final value $V_F$, is selected that will give the required accuracy in the CT estimates, as shown by box 24. During a production test, a ramp of the computed test length is applied to the DUT, a histogram of codes is produced, as shown in FIG. 3, and the CTs are estimated from the resulting histogram. Then, using the parameters computed during the training phase, that is, $\sigma_\theta$ and $\sigma_{e_\gamma}$, and the variance of the error in $\bar\gamma$ due to noise $\sigma_{e_\gamma}^2$, an optimal estimate for the CTs is made. Device binning is then performed on the basis of these optimal CT estimates.

Optimal Prediction of CTs

The histogram estimates of CTs can be modeled as $$\hat\gamma = \bar\gamma + \bar e_\gamma = \bar m_\gamma + A_\gamma \cdot \bar\theta + \bar e_\gamma$$

where $e_\gamma$ is the error in the estimate of $\gamma$.

It is assumed that $e_\gamma$, the error due to noise, is a random vector with zero mean and variance. It is also assumed that the elements of $e_\gamma$ are independent. This assumption is true as long as the input-referred noise of the ADC is less than the width of an LSB of the ADC. S. Max, supra. Under these assumptions, the estimates of the variables are given by $$\hat\theta = A_\gamma^T \cdot (\hat\gamma - \bar m_\gamma) = \bar\theta + \bar e_\theta$$

where $\bar e_\theta$ is characterized by variance $\sigma^2 e\theta_i$.

The elements of $\bar e_\theta$ are uncorrelated, since the columns of $A_\gamma$ are orthonormal. Since the variance of errors in $\hat\theta$ are known, a least squares estimate for $\bar\theta$ can be formed, as follows. For two random variables x and y with zero means, standard deviations $\sigma_x$ and $\sigma_y$, and correlation coefficient r, the least squares linear estimate for x given y is given by $$x = E(x \mid y) = r \cdot \frac{\sigma_x}{\sigma_y} \cdot y$$

Substituting $x=\theta_i$, the $i^{th}$ element of $\bar\theta$ and $y=\theta_i + e_{\theta i}$, produces an optimal estimate for $\bar\theta$, which is denoted $\tilde\theta$.

$$\tilde\theta_i = \frac{\sigma_{\theta i}^2}{\sigma_{\theta i}^2 + \sigma_{e\theta}^2} \cdot (\theta_i + e_\theta)$$

$$= \frac{\sigma_{\theta i}^2}{\sigma_{\theta i}^2 + \sigma_{e\gamma}^2} \cdot \bar A_{\gamma i}^T \cdot (\hat\gamma - \hat m_\gamma)$$

where $\sigma_{ei}$ is the standard deviation of $\theta_i$, and $\bar A_{\gamma i}$ is the $i^{th}$ column of $A_\gamma$.

The variance in the optimal CT estimates $\tilde\gamma$ can be shown to be $$\sigma_{e\gamma}^2 = \text{diag}[A_\gamma \cdot D[\sigma_{e\bar\theta}^2] \cdot A_\gamma^T]$$

where $\sigma_{\bar\theta}^2$ is the variance in the error in $\tilde\theta$, the diag[.] operator extracts the diagonal of a matrix, and the D[.] operator creates a diagonal matrix from a vector.

The values of $\sigma_{e\bar\theta}$ can be shown to be $$\sigma_{e\bar\theta i}^2 = \frac{\sigma_{\theta i}^2}{\sigma_{\theta i}^2 + \sigma_{e\gamma}^2} \cdot \sigma_{e\gamma}^2 \quad (5)$$

where $\sigma_{e\gamma}^2$ is the variance of errors in the CTs obtained from a histogram of the codes produced by the ADC under test.

Using the $\theta_i$ found above the optimal estimates to CTs are obtained from $$\tilde\gamma = \bar m_\gamma + A_\gamma \cdot \tilde\theta$$

Then, based on the estimates of CTs, INL and DNL may be computed as explained in the Background of the Invention.

Predicting Variance of Noise in CT Estimates

The optimal CT estimates in Equation 4 need the value for the variance in the errors in CT obtained from a histogram of codes produced by the DUT. The value of $\sigma_{e\gamma}^2$ may be derived as a function of the test length, given the variance of the input-referred noise of the ADC.

The noise sources inside the ADC are modeled as an equivalent noise source in series with the analog input of the ADC. As is well understood in the art, an ADC samples the input signal periodically and converts the sampled value to an output code. As is well understood from the Nyquist theorem, the sample rate must be at least twice the highest frequency of the input signal to reproduce the input signal faithfully. Thus, for a ramp input signal, there must be multiple samples between each CT. For an input signal V(t), the samples captured by the ADC would be $s_i = V(i\tau) + e_n(i\tau) = V_i + e_n$, where i is the index of the sample ADC, and $\tau$ is the period of the sampling clock of the ADC. The random process $e_n(i\tau)$ is an independent and identically distributed ("i.i.d") Gaussian process, having zero mean and standard deviation $\sigma_n$. The value of $\sigma_n$ is usually not known a priori and has to be estimated experimentally from a set of ADCs, as will be understood by those skilled in the art.

Figure 4:
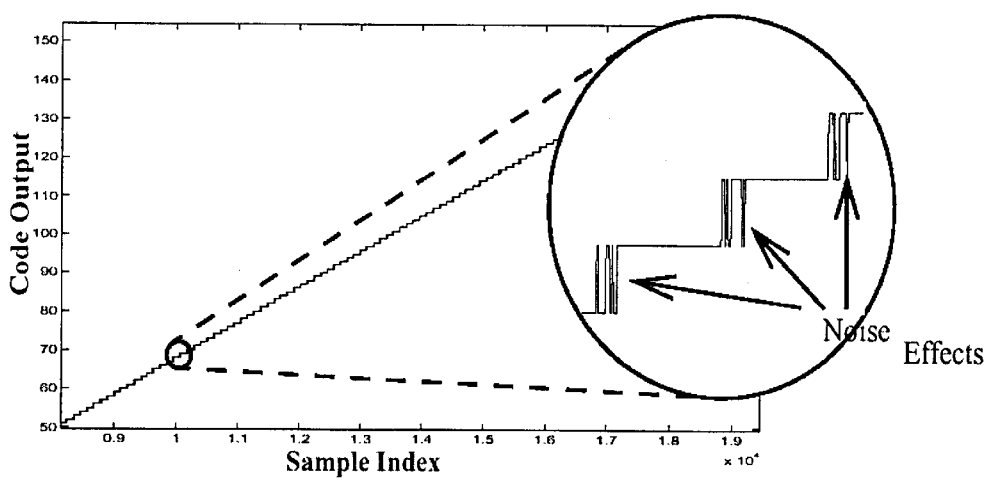
FIG. 4 shows the typical output of an analog-to-digital converter in response to a ramp input.

FIG. 4 illustrates the measured output of an 8-bit ADC with a linear ramp input having an average of 128 samples/code. It can be seen that when the input to the ADC is near the code transitions, the output of the ADC switches randomly between adjacent codes due to noise in the ADC. Thus, the CTs estimated from a histogram of this output will have two sources of errors:

1. If there are n samples (on the average) per code of the ADC, the minimum step change possible in the measured DNL is 1/n, so that the resolution of the measurement is restricted to 1/n LSBs; and 2. The noise in the ADC will cause it to give wrong output codes for an input signal near a CT.

Figure 5:
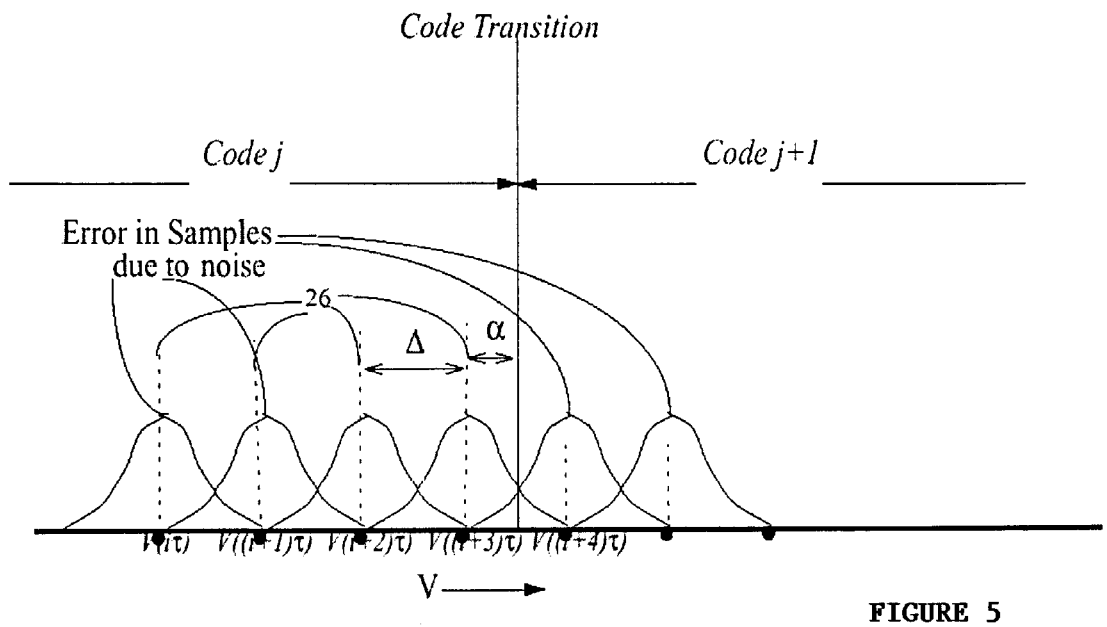
FIG. 5 shows how errors are produced in the histogram of FIG. 3 as a result of noise.

FIG. 5, which shows voltage samples near a code transition from j to j+1, illustrates the effects of these two sources of errors. The horizontal axis represents voltage input to the ADC and the dashed vertical lines 26 represent the sample voltages that would have been obtained for an ideal (noise-free) ADC in response to the input voltage V(nτ). For voltage samples near the CT, voltage samples which should ideally have given code j at the output have a non-zero probability of giving a output code greater than j due to ADC noise and vice-versa. Since the voltage samples are spaced Δ Volts apart, the resolution of the CT measurement is Δ Volts.

To explain the effect of noise and finite resolution of measurement on the estimation of the CT, the following two definitions are used.

$$V_b = \max(V_i | P[C(V_i + e_n) > j] \approx 0)$$

That is, $y_b$, is the largest sample value of the input signal that has (approximately) zero probability of giving an output code greater than j. $C(x)$ is the code at the output of the ADC when x is the input value.

$$S = \{s_i | P[C(s_i) = j] > 0 . P[C(s_i) > j] > 0\}$$

That is, S is a set of samples that have non-zero probabilities of giving an output code greater than or equal to j depending on the value of noise on the samples. The true value for the CT γ is given by $\gamma_j = V_b + m\Delta + \alpha$ where Δ and α are as indicated in FIG. 5. It is assumed that the CT can occur at any point between the two voltage samples with equal probability, that is, α can vary uniformly from 0 to Δ.

Under the forgoing definitions, the measured value of the CT is given by $$\hat{\gamma}_j = V_b + k\Delta + \frac{\Delta}{2}$$

where k is the number of elements (samples) in the set S', defined as $$S' = \{S_i | S_i \in S, C((S_i) \leq j)\}$$

That is, S' is the subset of S that give outputs less than or equal to j. The error in estimation of γ, $e_{\gamma j} = \gamma_j - \hat{\gamma}_j$ is grivren by $$(m-k)\Delta + d j - \frac{\Delta}{2}.$$

The mean square value of $e_{\gamma j}$ is given $$E(e_{\gamma j}^2) = \Delta \int_{x=0}^{\Delta} E((m-k)^2 | \alpha = x) dx + \qquad (6)$$

$$2 \cdot \int_{x=0}^{\Delta} E((m-k) | \alpha = x)\left(\alpha - \frac{\Delta}{2}\right) dx + \frac{\Delta^2}{12}$$

where E(x|y) is the conditional expectation of x given the value of y; and m is the true value of k if there were no noise.

The mean of $e_\gamma$, which is assumed to be Gaussian, is zero, so the variance $\sigma_{e_\gamma}^2$ is just the mean square of $e_\gamma$, $E(e_\gamma^2)$.

The foregoing Equation 6 requires the estimation of for $E((m-k)|\alpha=x)$ and $E((m-k)^2|\alpha=x)$. Since m is a constant, only the estimated mean and variance of k are needed. For a given value of α, the random variable k can be modeled as $$k = \sum_{i \in S} \mu_i$$

where $\mu_i = 1$ iff, and $\mu_i = 0$ otherwise. The probabilities of $\mu_i$ being equal to one is given by $$P[C(s_i) \leq j] = P[V_i + e_n \leq \gamma]$$

$$= P[e_n \leq \gamma - V_i] = \frac{1}{\sqrt{2\pi} \cdot \sigma} \int_{x=-\infty}^{\gamma - V_i} e^{\frac{x^2}{2\sigma_n^2}} dx$$

$$= 1 - Q\left(\frac{\gamma - V_i}{\sigma_n}\right)$$

where $$Q(\alpha) = \frac{1}{\sqrt{2\pi}} \cdot \int_{x=\alpha}^{\infty} e^{\frac{x^2}{2}} dx$$

Substituting $\gamma - V_i$ equal to $i\Delta + \alpha$, produces $$P[\mu_i = 1] = 1 - Q\left(\frac{i\Delta + \alpha}{\sigma_n}\right) = \beta_i$$

$$P[\mu_i = 0] = 1 - \beta_i$$

The mean of $\mu_i$ is equal to $\beta_i$ and the variance of $\mu_i$ is equal to $\beta_i(1-\beta_i)$. Therefore the mean and variance of k are given by $$E(k) = \sum_{i \in S} \beta_i$$

$$\sigma_k^2 = \sum_{i \in S} \beta_i - \sum_{i \in S} \beta_i^2$$

Now, $\sigma_{e_\gamma}^2$ is estimated by substituting $E(k)$ and $\sigma_k^2$ into Equation 6 for $E((m-k)|\alpha=x)$ and $E((m-k)^2|\alpha=x)$, respectively.

For a linear ramp or triangular wave, the resolution in measurement Δ is independent of the CT. For a test signal having N samples of ADC output, Δ is given by $$\Delta = \frac{V_{FS}}{N} \text{ Volts} = \frac{2^n}{N} LSBs$$

where $V_{FS}$ is the full-scale voltage of the ADC and n is the number of bits.

Equation 6 is then integrated numerically.

Selecting the Test Length

The standard deviation in the optimal estimates of CT $\sigma_{e_\gamma}$ can be estimated from equation (4). However, the accuracy requirements on CTs are usually specified in terms of the maximum error allowable. Therefore, the variance should be converted into the maximum error. To achieve this, the error in $\sigma_{e_\gamma}$ is modeled as a Gaussian random variable. For a Gaussian random variable with standard deviation given $\sigma_{e_\gamma}$, a number z is found such that, with a probability 1−ε, the error in measurement will not exceed ($z \cdot \sigma_{e_\gamma}$). That is, z represents positive and negative limits of integration of the Gaussian distribution function which will produce a probability 1−ε, where ε is an acceptable level of confidence in the estimates of the CT.

$$P[|e_{\tilde{\gamma}}| \leq \delta] = 1 - \epsilon$$

where P[.] denotes the probability operator.

$\epsilon$ is a very small value like $10^{-5}$ or $10^{-6}$, which is used because the Giaussiall random variable has a non-zero probability of being any value. For example, if $\epsilon$ is chosen to be $10^{-3}$, z would be 3.0309, because a Gaussian random variable has a probability of $10^{-3}$ of being greater than 3.0309 times its standard deviation.

Therefore, a minimum test length is chosen such that $\sigma_{e\bar{\gamma}}$ is less than $\eta/z$ where $\eta$ is the maximum allowable error in the measurement.

$$\max(\sigma_{e\bar{\gamma}}) \leq \eta/z$$

A lower value of $\epsilon$ will result in a larger value of z and hence a larger test length.

Test System

Figure 6:
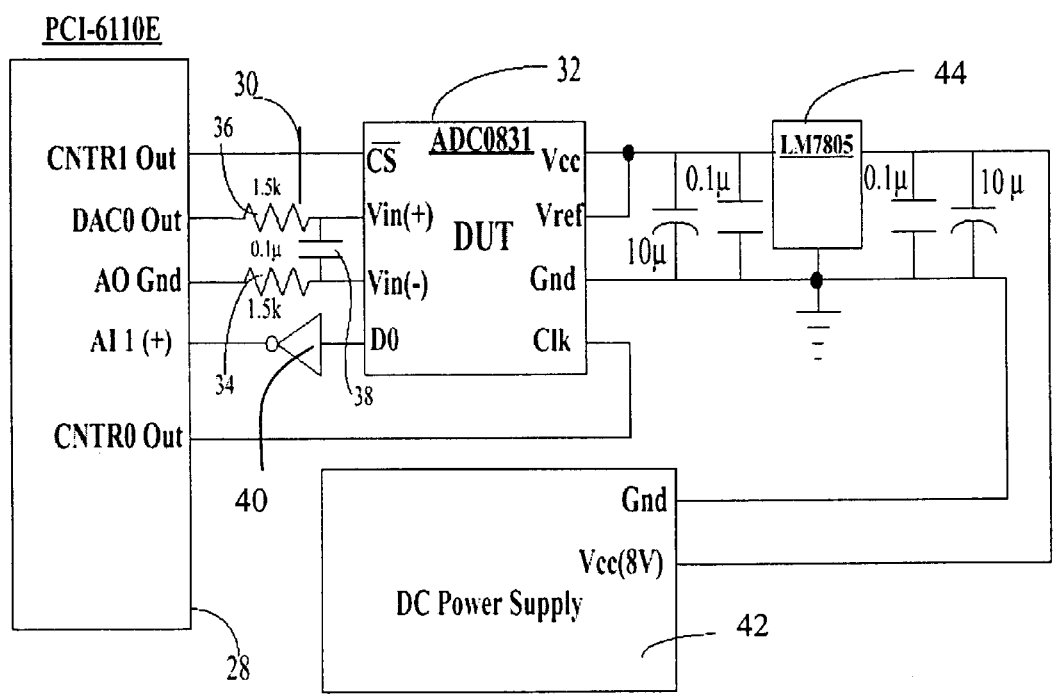
FIG. 6 is a schematic diagram of a test circuit for analog-to-digital converter measurements according to the present invention.

A system that may be used to make measurements on the ADCs is shown in FIG. 6. A PCI-6110E™ Data Acquisition ("DaQ") plug-in card 28, available from National Instruments Corporation, may used to generate a linear ramp for input to the ADC under test and to transfer the outputs of a ADC under test 32 to a computer (not shown) to process the data. A low-pass filter 30, consisting of two 1.5 k ohm resistors 34 and 36, and a 0.1 $\mu$F capacitor 38 may be used to filter out high frequency noise and unwanted artifacts from the output of the card 28. The DaQ card also has two general-purpose counters which may be used to generate the timing signals (clock and chip select) for the ADC under test. A 74HC04 inverter 40 is used to buffer the output from the ADC under test to the DaQ card 28. An LM7805 3-terminal regulator 44 may be used to provide a stable power supply and reference to the ADC under test. Lab-VIEW™ software is preferably used to control the DaQ card for data acquisition.

The aforedescribed system may be used both to acquire training data and to test individual ADCs after production, though it is anticipated that the user would design a test system that provides these capabilities, employing general electrical engineering knowledge, which particularly suits the user's applications The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method for making optimal estimates of linearity metrics of an analog-to-digital converter, comprising:

constructing a statistical model of transition code voltages of the analog-to-digital converter based on application of a test input signal to a plurality of training analog-to-digital converters of like kind and measurements of the transition code voltages of said plurality of training analog-to-digital converters, said statistical model being adapted to produce an estimate of the transition code voltages for an individual analog-to-digital converter in response to a plurality of scaling inputs;

generating said scaling inputs by applying said test signal as an input to said individual analog-to-digital converter, measuring the transition code voltages thereof, and computing a least-squares estimate of said scaling inputs given said measured transition code voltages; and applying said generated scaling inputs to said statistical model to produce a set of estimated transition code voltages of said individual analog-to-digital converter that are more accurate than said measured transition code voltages thereof.

2. The method of claim 1, wherein said test signal is a ramp signal.

3. The method of claim 1, wherein said scaling inputs may be represented by a scaling matrix and said statistical model is a model matrix of values such that, when said model matrix is multiplied times said scaling matrix and the product thereof is added to the corresponding mean values of said transition code voltages of said plurality of analog-to-digital converters, the sum is said set of estimated transition code voltages.

4. The method of claim 3, wherein said model matrix is generated by singular value decomposition of a matrix of values representing the difference between measured transition code voltages of said plurality of training analog-to-digital converters and their respective means.

5. The method of claim 4, wherein said least squares estimate of said scaling inputs is computed by computing the variances of the scaling values, the mean transition code voltages, and the variance of the error in transition code voltages from said plurality of training analog-to-digital converters, selecting a test length for the test signal, applying said ramp signal as an input to said individual analog-to-digital converter, constructing a histogram of the output codes therefrom, multiplying the ratio of said variances of scaling values to the sum of the variances in scaling values plus variances of the error in transition code voltages times the transpose of the model matrix, and multiplying the product thereof times the differences between the transition code voltages and their respective means.

6. The method of claim 5, wherein the probability distribution function for the noise in said individual analog-to-digital converter is assumed to be Gaussian.

7. The method of claim 6, wherein said measurement length is selected such that the standard deviation in the error of the transition code voltages is less than the ratio of the maximum allowable error in measurement to a limit of integration of the probability distribution of error in the transition code voltages that produces an acceptable probability of error.

8. The method of claim 1, wherein said least squares estimate of said scaling inputs is computed by computing the variances of the scaling values, the mean transition code voltages, and the variance of the error in transition code voltages from said plurality of training analog-to-digital converters, selecting a test length for the ramp signal, applying said ramp signal as an input to said individual analog-to-digital converter, contacting a histogram of the output codes therefrom, multiplying the ratio of said variances of scaling values to the sum of the variances in scaling values plus variances of the error in transition code voltages times the transpose of the model matrix, and multiplying the product thereof times the differences between the transition code voltages and their respective means.

9. The method of claim 8, wherein the probability distribution function for the noise in said individual analog-to-digital converter is assumed to be Gaussian.

10. The method of claim 9, wherein said measurement length is selected such that the standard deviation in the error of the transition code voltages is less than the ratio of the maximum allowable error in measurement to a limit of integration of the probability distribution of error in the transition code voltages that produces an acceptable probability of error.

11. A system for making optimal estimates of linearity metrics of a test analog-to-digital converter, comprising:

a test signal generator for producing a test signal for input to the test analog-to-digital converter;

a processor for receiving both said test signal and digital codes produced by the test analog-to-digital converter in response to said test signal, said processor including a component for determining the mean values of the transition code voltages of the test analog-to-digital converter, a component for determining the variance of the errors in the transition code voltages of the test analog-to-digital converter from said mean values of the transition code voltages of the test analog-to-digital converter, the variance of the errors in the transition code voltages of the test analog-to-digital converter, a set of predetermined data representing the variance of transition code voltages in a training plurality of like analog-to-digital converters and a statistical model of the test analog-to-digital converter based on said training plurality of like analog-to-digital converters, and a component for computing estimates of the transition code voltages of the test analog-to-digital converter.

12. The system of claim 11, wherein said test signal is a ramp signal.

13. The system of claim 11, wherein said processor for receiving both said test signal and digital codes produced by the test analog-to-digital converter in response to said test signal comprises a component for constructing a histogram of codes produced by the test analog-to-digital converter and, from said histogram, computing the mean transition code voltages and variance of error in transition code voltages of the test analog-to-digital converter.

14. The system of claim 13, wherein said processor for receiving both said test signal and digital codes produced by the test analog-to-digital converter in response to said test signal further comprises a component for computing a least squares estimate of scaling values which, when applied to said statisical model of the test analog-to-digital converter, produce said estimated transition code voltages of the test analog-to-digital converter.

15. The system of claim 14, further comprising a modeling signal generator for producing a modeling signal for input to the training plurality of analog-to-digital converters, a modeling processor for receiving both said modeling signal and digital codes produced by the training plurality analog-to-digital converters in response to the modeling signal, and determining the transition code voltages of the training plurality of analog-to-digital converters, determining the mean values of the transition code voltages of the training plurality of analog-to-digital converters and, from that data, constructing a statistical model of a test analog-to-digital converter which receives as an input a set of scaling values derived from the test analog-to-digital converter and produces as an output estimates of the transition code voltages of the test analog-to-digital converter.

16. The system of claim 15, wherein said modeling processor also computes the variance of error in the transition code voltages of the training plurality of analog-to-digital converters.

17. The system of claim 15, wherein said modeling signal is a ramp signal.

* * * * *

UNITED STATES PATENT AND TRADEMARK OFFICE
CERTIFICATE OF CORRECTION

PATENT NO.   : 6,476,741 B2
DATED         : November 5, 2002
INVENTOR(S)  : Sasikumar Cherubal and Abhijit Chatterjee It is certified that error appears in the above-identified patent and that said Letters Patent is hereby corrected as shown below:

Column 12,
Line 50, delete "contacting a histogram" insert -- constructing a histogram --.

Column 13,
Lines 5 and 6, delete "said processor including a component for";
Line 8, delete "a component for";
Line 10, delete "analog-to-digital converter" insert -- analog-to-digital converter, and, --;
Lines 18-19, delete "and a component for".

Signed and Sealed this

Twenty-first Day of March, 2006

JON W. DUDAS
*Director of the United States Patent and Trademark Office*